(12) United States Patent
Rebstock

(10) Patent No.: US 7,751,919 B2
(45) Date of Patent: Jul. 6, 2010

(54) METHOD FOR OPERATING EQUIPMENT USING BUFFER STATION HAVING EMERGENCY ACCESS

(75) Inventor: Lutz Rebstock, Gaienhofen (DE)

(73) Assignee: Dynamic Micro Systems, Radolfzell (DE)

(*) Notice: Subject to any disclaimer, the term of this patent is extended or adjusted under 35 U.S.C. 154(b) by 228 days.

(21) Appl. No.: 11/881,091

(22) Filed: Jul. 25, 2007

(65) Prior Publication Data

US 2008/0046108 A1 Feb. 21, 2008

Related U.S. Application Data

(60) Provisional application No. 60/838,594, filed on Aug. 19, 2006.

(51) Int. Cl.
| | |
|---|---|
| G06F 19/00 | (2006.01) |
| G05B 11/01 | (2006.01) |
| G05B 9/02 | (2006.01) |
| B65G 15/64 | (2006.01) |
| B65G 21/22 | (2006.01) |
| B65G 47/22 | (2006.01) |
| B65G 47/24 | (2006.01) |
| E02F 3/00 | (2006.01) |
| B66B 1/48 | (2006.01) |

(52) U.S. Cl. ............... 700/100; 700/21; 700/79; 700/101; 700/115; 700/228; 198/345.2; 198/345.3; 198/347.1; 414/601; 414/602; 414/719

(58) Field of Classification Search ............... 700/2–3, 700/21, 79, 82, 100–101, 115, 228, 230; 198/345.2–345.3, 347.1; 414/601–602, 719

See application file for complete search history.

(56) References Cited

U.S. PATENT DOCUMENTS

| | | | | |
|---|---|---|---|---|
| 3,845,286 | A * | 10/1974 | Aronstein et al. | 700/102 |
| 4,870,592 | A * | 9/1989 | Lampi et al. | 700/112 |
| 5,216,613 | A * | 6/1993 | Head, III | 700/102 |
| 5,446,669 | A * | 8/1995 | Yamashita et al. | 700/100 |
| 6,890,862 | B2 * | 5/2005 | Wagner et al. | 438/706 |
| 2002/0094257 | A1 * | 7/2002 | Babbs et al. | 414/277 |
| 2002/0095223 | A1 | 7/2002 | Chang et al. | |
| 2004/0234360 | A1 * | 11/2004 | Hayashi | 414/217 |
| 2006/0039781 | A1 * | 2/2006 | Niewmierzycki et al. | 414/217 |
| 2006/0045665 | A1 * | 3/2006 | Hall et al. | 414/217 |
| 2006/0154385 | A1 * | 7/2006 | Aggarwal | 438/14 |
| 2006/0263177 | A1 * | 11/2006 | Meulen | 414/217 |
| 2007/0043464 | A1 * | 2/2007 | Zeif | 700/108 |
| 2007/0264106 | A1 * | 11/2007 | van der Meulen | 414/217 |
| 2007/0269297 | A1 * | 11/2007 | Meulen et al. | 414/222.01 |
| 2008/0080963 | A1 * | 4/2008 | Bufano et al. | 414/788 |
| 2008/0085173 | A1 * | 4/2008 | van der Meulen | 414/222.07 |
| 2008/0086237 | A1 * | 4/2008 | Rebstock | 700/248 |
| 2008/0091301 | A1 * | 4/2008 | Brantmark et al. | 700/245 |
| 2008/0163096 | A1 * | 7/2008 | Pannese et al. | 715/772 |

* cited by examiner

*Primary Examiner*—Ramesh B Patel
(74) *Attorney, Agent, or Firm*—Tue Nguyen

(57) ABSTRACT

A buffer station provides potential improvement for the operation of a facility. By storing to-be-accessed workpieces in the buffer stations of an equipment, the operation of the facility is not interrupted when the equipment is down. The workpieces can be retrieved through emergency access port of the buffer station, thus ensure the continuous supply of workpieces for the workpiece flow of the facility. Algorithm for getting the needed workpieces to the buffer station is also provided through a controller or a computer mechanism. The buffer station can be incorporated in a stocker, such as wafer stocker or reticle stocker.

20 Claims, 4 Drawing Sheets

METHOD FOR OPERATING EQUIPMENT USING BUFFER STATION HAVING EMERGENCY ACCESS

This application claims priority from U.S. provisional patent application Ser. No. 60/838,594, filed on Aug. 19, 2006, entitled "Buffer station for stocker system"; which is incorporated herein by reference.

FIELD OF THE INVENTION

The present invention relates to semiconductor equipment, and more particularly, to equipment and method to improve fabrication facility processing.

BACKGROUND

Stockers generally are installed within a semiconductor facility for temporarily storing workpieces, such as wafers, flat panel displays, LCD, photolithography reticles, or masks.

In the process of manufacturing semiconductor devices, LCD panels, and others, there are hundreds of processing equipments and thus hundreds of manufacturing steps. It is very difficult for the flow of the wafers, flat panels, or LCDs (hereafter workpiece) to be uniform from step to step, from tool to tool. Despite the best planners, there is always the unexpected scenario, such as a tool down, an emergency lot coming through, a periodic maintenance lasting longer than planned, thus there are various accumulations of the workpieces at certain steps for certain tools. The accumulated workpieces will need to be stored in a storage stocker, waiting to be processed.

Further, photolithography process is a critical process in the semiconductor fabrication facility, involving a large number of photolithography masks or reticles (hereinafter reticle). The reticles thus are typically stored in a storage stocker, and being retrieved when needed into the lithography exposure equipment.

The storage of workpieces and reticles (hereafter articles) is much more complicated due to the requirement of cleanliness. Damages to the articles can be physical damages in the form of particles, or chemical damages, in the form of interactions. With the critical dimension of the semiconductor device processing surpassing 0.1 micron, particles of 0.1 micron size, and reactive species will need to be prevented from approaching the articles. The storage areas typically would need to be even cleaner than the processing facility, to ensure less cleaning between processing.

Thus the stocker storage areas is typically designed to be sealed off from the outside environment, preferably with constant purging, and even with inert gas flow to prevent possible chemical reactions. Access to the storage areas is load-locked, to ensure isolation between the clean storage environment and the outside environment.

This creates a potential problem in the event of the failure of the stocker, such as a transport malfunction, or a load lock malfunction, the stocker storage becomes isolated, with no way to retrieve articles from the stocker storage. This failure, through the chain reaction, could shut down a large portion of the fabrication facility.

SUMMARY

Methods and apparatuses for improving the operation of a facility are disclosed. In exemplary embodiments, the operation improvement of a facility is achieved through a plurality of buffer station. The buffer station can be an interfacial station between a chamber and an IO station with an emergency access port. Typical workpiece retrieval comprises moving the workpiece from the chamber to the buffer station and then to the IO station where the workpiece can be taken out to another equipment. Typical workpiece storage (or other operation) comprises moving the workpiece from the IO station to the chamber, bypassing the buffer station. Alternatively, the workpiece can move from the IO station to the buffer station before being transferred to the chamber.

In exemplary embodiment, the buffer station stores the workpiece to be needed. Thus when recalled, the workpiece will be brought directly from the buffer station to the IO station, instead from the chamber. For example, if workpiece A is anticipated to be needed, it will be brought to the buffer chamber. And when needed, the workpiece can be retrieved from the buffer chamber.

In exemplary embodiments, the invention further comprises an algorithm or a controller for determining the sequence of the workpiece flow, for example, to anticipate or to know the workpieces to be brought to the buffer station. In a facility, such as a semiconductor fabrication facility, the workpiece flow can be imported to the controller as an input.

In exemplary embodiment, the buffer station comprises an emergency access port. The emergency access port can allow accessing the workpiece when the equipment fails, for example, when the robotic mechanism is not operationable to bring the workpiece to the IO station. Accessing the workpieces from the buffer station through the emergency access port allows the facility to continue to operate even in the event of the equipment failure. Since the buffer station stores the workpieces to be needed in the sequence flow, the operation of the facility is not interrupted.

In exemplary embodiments, the buffer station is designed to store the workpieces for the average time needed to repair the equipment, or a predetermined period such as 24 hours. The emergency access can be performed by an operator or emergency equipment. Loadlock or interface with the emergency access port can be provided to prevent workpiece contamination, for example, by exposure to the outside environment.

In exemplary embodiment, the buffer station can be arranged in a linear XY two dimensional array facing the clean room environment, and which is served as an interface for a stocker, such as a wafer stocker or a reticle stocker.

DETAILED DESCRIPTION OF THE INVENTION

Figure 1:
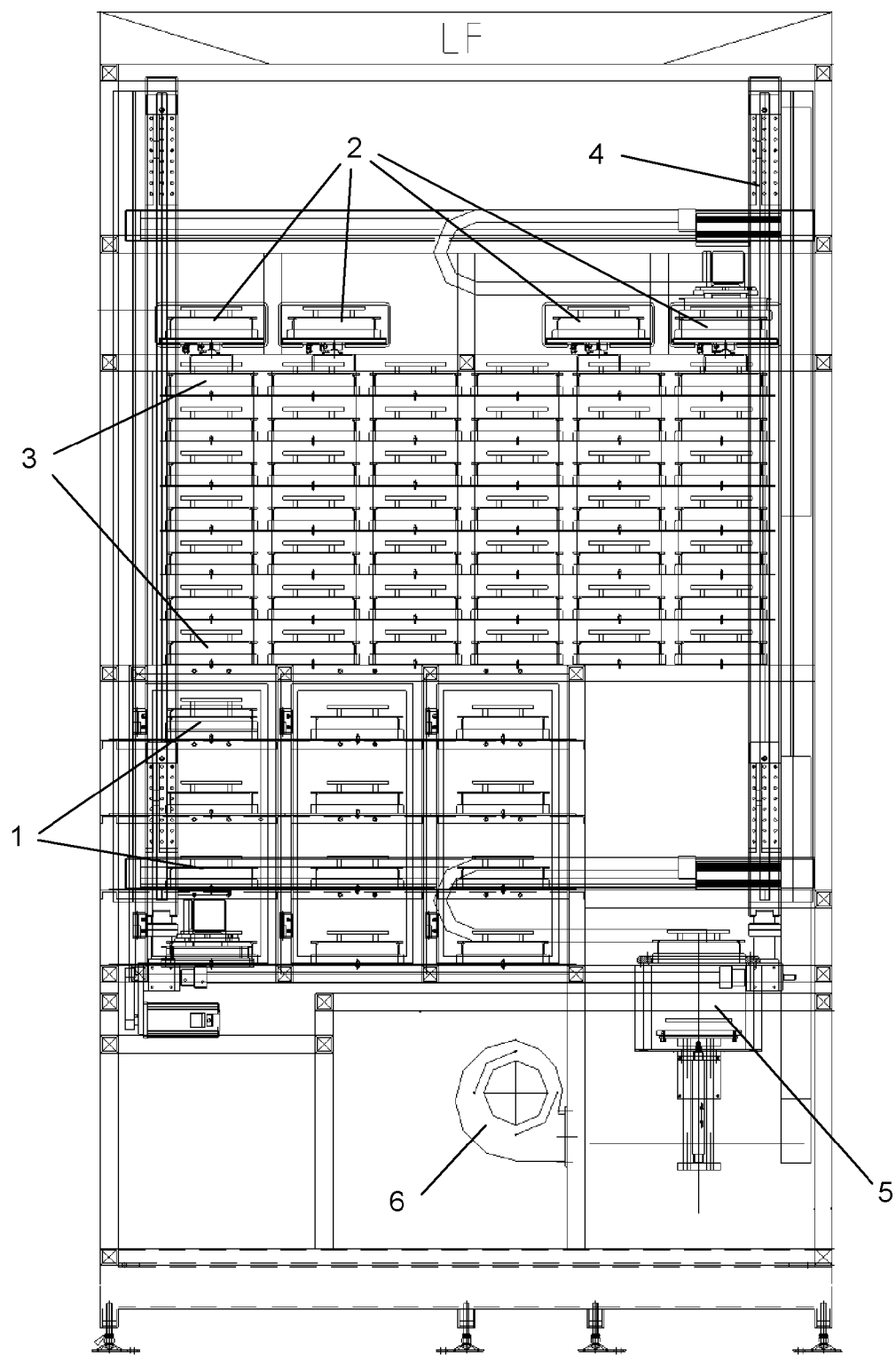
FIG. 1 shows a front view of an embodiment of a reticle stocker, utilizing buffer stations.

The present invention, in general, pertains to methods and apparatuses for a storage stocker system with stocker management for a fabrication facility. According to one embodiment, an output buffer for emergency retrieval is provided. The present invention output buffer provides a retrieval mechanism in the event of the failure of the equipment, such as a reticle storage stocker. The output buffer is preferably associated with a stocker, such as a reticle stocker, to provide articles out of the stocker in the event of the failure of the stocker. According to another embodiment, an input/output (IO) buffer for increasing throughput is provided. The IO buffer is preferably associated with a stocker, such as a reticle stocker, to facilitate the transfer of the articles in and out of the stocker. According to still another embodiment, stocker management, methodology and apparatus for output buffer and IO buffer are provided.

Cost of ownership is probably one of the most important features in a fabrication equipment and process. Low cost of ownership enables the products to be produced at a low expense, resulting in either high profit margin or high volume sale. Cost of ownership improvements includes the ability to support the flow of the fabrication facility, even in the even of the equipment failure, and the reduction of waiting time, especially for operators.

In one aspect, the present invention discloses a management methodology and apparatuses to a fabrication equipment so that in the event of the failure of that particular fabrication equipment, it still can support the operation of the fabrication facility while waiting for repair.

In one embodiment, the present invention discloses an output buffer for emergency retrieval. The output buffer comprises an emergency access to allow the retrieval of the articles even when there is a general failure. The emergency access can be an emergency door, preferably at the front side, or an equipment access that is not normally use such as an access used by a robot handling in the normal operation. The emergency access can be handled by an operator, or by an external handling equipment. The external handling equipment is preferably independent to be able to operate even with a general failure.

The output buffer is generally designed for robotic access, thus can be very compact with minimum spare volume. The output buffer can be much smaller than an IO loader, which is designed for operator handling or automatic transfer handling such as an Overhead Transfer system (OHT). Since manual access occurs only in emergency, ergonometric or operator comfort issues can be relaxed, and therefore the output buffer can achieve a minimum volume, resulting in low equipment footprint.

The output buffer is designed for emergency transfer to process equipment, thus should be designed with contamination concerns accordingly. Thus in general, the output buffer is treated like an IO loader with respect to the issue of transportation. For example, the articles stored in the output buffer is preferably stored in the form that can be handled or transported in a clean room environment, as in the case of the articles stored in the IO loaders. Thus the articles are preferably stored in carrier boxes, so that there is no contamination or damage to the articles during the transfer to the needed tools. The carrier boxes can be designed for operator handling, or for OHT handling.

The output buffer is preferably stored the articles to be needed next, and more preferably stored an adequate number of articles for a predetermined period so that the operation of the fabrication facility is not stopped or inconvenient during a general failure. The output buffer can comprise individual compartments, to store carrier boxes. The carrier boxes can contain a single article, or a plurality of articles, to be transported.

The output buffer can be generally associated with IO loaders so that in the normal course of process fabrication flow, the output buffer can provide articles to the IO loaders to be transferred to the process equipment needing the articles. In certain situations, the output buffer can be considered as an extension of the IO loaders, to increase the number of IO loaders to reduce waiting time. The output buffer can be much smaller than the IO loader, thus a combination of output buffer and IO loader can provide a larger number of IO ports for a smaller volume. The output buffer and the IO loader can have the same robotic handling system. The IO loader can also be associated with either an operator handling or an OHT handling system. For acting as an extension to the IO loader, the output buffer might not need the emergency access.

The output buffer can be designed side by side with the IO loaders, with the same access robotic handler. The output buffer can be 2-dimensional shelves, for example a 6×7 array of shelves to store articles in their carrier box. The dimension of the output buffer depends on the flow of the facility, the number of articles needed in a predetermined period, and the needed time to repair the equipment. The IO loader can also be 2-dimensional shelves, for example a 3×4 array of shelves. The IO loaders generally require doors, and sometimes even acting as a load lock, for isolate the inside of the equipment to the outside environment. The IO loader can also be one dimensional shelf, for example a linear line of 4 IO loaders, typically on top of the equipment for overhead transfer system (OHT).

The output buffer can be associated with a process equipment, or a stocker, such as a workpiece stocker or a reticle stocker, to provide articles out of the stocker in the event of the failure of the stocker. The output buffer preferably stores the articles to be needed next, and more preferably stores an adequate number of articles for a predetermined period during which the stocker can be repaired. With the output buffer storing the articles needed for the next period, for example 24 hours, the stocker provides a fail-safe mechanism to the fabrication facility, since even in the event of the stocker failure, the operation of the fabrication facility is not affected. By using the emergency access, the stocker even when inoperative, can provide articles for the general work flow of the facility when the stocker itself is undergone repaired.

In an embodiment, the present invention discloses a storage system employing an output buffer. The articles stored in the output buffer are preferably stored in transfer format such as carrier boxes, to allow transporting the articles to the needed equipment.

The storage system, such as workpiece or reticle stocker, generally comprises a storage area with an IO loader section, communicated by a robotic handling system. The storage area is preferably cleaner than the outside environment, and therefore the storage system preferably comprises a load lock linking the storage area to the IO loader. The storage area can store the articles in their bare form (e.g. only the article is stored), in their transfer form (e.g. inside carrier boxes), or in their storage form. The storage form is typically between bare and transfer forms, providing better coverage and protection than the bare form, but not as much as the transfer form.

The storage form also can provide emergency protection to the articles in the storage area, in the event of the environmental breach. In the failure of e.g. clean air flow, the articles stored in bare form in the storage area can be all contaminated. A storage form can prevent the contamination. The storage form can be much simpler than a transfer form, since the storage form is not designed for transportation. Thus storage in storage form is much more cost effective than storage in transfer form.

In a typical storing operation, the articles in their transfer form, e.g. a carrier box, are loaded into IO loaders. The robotic handler retrieves the carrier boxes, and brings to the load lock for contamination-free transfer to the storage area. The robotic handler, preferably a second robotic handler operated in cleaner environment, pick up the carrier box, or pick up the article, leaving behind the carrier box, and transfer it to the storage area. A storage box assembly might be located between the load lock and the storage area for the assembly of the storage container to the articles, if needed.

For the retrieving operation, the articles are retrieved from the storage area by the cleaner robotic handler, passing through the storage box assembly, if needed, then transferred to the load lock area to be pick up by the IO robotic handler. The IO robotic handler can assemble a carrier box to the articles if the articles are in their bare form. The immediately needed articles are stored in the IO loaders to be transferred. The to-be-needed articles are stored in the output buffer. The robotic can also transfer the immediately needed articles from the output buffer to the IO loader, since the output buffer stores the articles to be used in the immediate future. The IO loader can be the operator loader, or the OHT loader.

The storage system can communicate with the fabrication facility to know what articles to be needed, immediately and in the near future. Thus the storage system can retrieve the articles from the storage area and store in the output buffer and the IO loader. The communication equipment can be a controller or a computer system, managing the information retrieval and sequencer for the workpiece flow of a facility. The algorithm can determine the workpieces to be stored in the buffer stations, waiting to be accessed.

The output buffer, with its emergency access, allows the storage system to contribute to the work flow, even in a failure even. Further, with the transfer from the output buffer to the IO loader, the storage system can have a higher throughput, since the transfer to the IO loader is from the output buffer, not from the inner storage area.

The storage system can be a reticle stocker, storing reticles in either bare form, storage form or transfer form. The storage area is preferably a high density storage area to reduce equipment footprint. An optional storage form assembly can be included between the storage area and the load lock area for changing the article form.

In another embodiment, the present invention discloses a methodology for a fail-safe equipment, especially for a storage system. The method comprises a determination of the articles to be needed in a predetermined period in the immediate future, and then retrieving these articles and storing them in an output buffer. The output buffer has an emergency access to allow the retrieval of the articles in the event of equipment failure. In normal operation, the IO loaders can retrieve articles from the output buffer.

In an embodiment, a method of stocking reticles in a manufacturing process involves a reticle stocker and reticle buffer area. The method includes conducting a status check to determine the reticles to be needed within a certain amount of time, and then preparing to have the reticles to be transported to the buffer area from reticle stocker storage system.

In another aspect, the present invention discloses a management methodology and apparatuses to a fabrication equipment to reduce the waiting time, especially for operators. The present invention discloses an IO buffer for minimizing waiting time, especially for operator.

Different process tools have different tool throughput with high throughput tools require high number of IO loaders. For example, for a deposition tool with 50 wafers per hour throughput, only 2 loaders are needed per hour for 2 wafer carriers with 25 wafers per carrier. For a metrology tool which only measures one wafer per carrier with 50 wafers per hour throughput, 50 loaders are needed per hour.

To accommodate this requirement of high throughput and metrology tools, an IO buffer adjacent the IO loaders is included, so that wafer carriers may be stored locally and adjacent such IO loaders. Such IO buffers are generally configured adjacent the tool IO loaders, and include shelves for storing wafer carriers with a transport system for transferring the wafers carriers to and from the IO buffer.

The IO buffer is similar to the output buffer, except without the emergency access, since the IO buffer only transfer to and from IO loaders. The IO buffer can be small, since it does not need the ergonometry nor the comfort for the operation handling or automatic OHT handling.

The buffer system is used with single reticle carrier boxes. Single reticle carrier boxes only contain one reticle within each box, and therefore the transferring of a number of reticles would take a long time. Thus the number of IO loaders is desired to be as large as possible to handle throughput issue. A typical number is between 10 to 20. However, even with this number, it might not be enough. IO loaders take up space, since it is designed for human or automatic OHT interaction, and therefore it has to ergonomic to prevent repetitive stress induced damage. Thus increasing number of IO loaders is not desired.

IO buffer of the present invention serves the need. IO buffer is not designed for human interaction, therefore the space can be very much smaller than an IO loader. A balanced number of IO loaders and IO buffers thus can be optimum for space constraint and throughput constraint. The addition of IO buffer would ease the burden on the space requirement for IO loader. A number of IO loaders together with a number of IO buffer would optimize the facility requirements and the floor space requirements. Output buffer also can double as IO buffer.

In another aspect, the present invention discloses a 2-D array of output buffer (or IO buffer) with XY linear guide robotic for accessing operation. The array can also include a 2-D array of operator IO loaders, or 1-D line of IO loader at the top for OHT transport. The 2-D array can form the front face of the tool.

FIG. 1 shows a schematic of a front view of a reticle stocker according to one embodiment of the present invention. The stocker comprises an array of 3×4 IO loaders 1 with individual compartments and door access. The IO loaders 1 are designed for operator access, thus located at reasonable height. The stocker also comprises a linear array of 4 IO loaders 2 for OHT transport, located on top of the stocker.

The stocker comprises an array of 6×7 output buffer compartments 3 for among other things, emergency access. The output buffer is not subjected to operator requirements, thus can be located essentially anywhere. A 2-D linear guide robotic system 4 provides access to the IO loaders 1 and the output buffer 3. Also shown is the load lock system 5, to transfer the articles between the IO loader/output buffer and the storage area. There are other components, such as air flow 6, emergency stop, etc.

Figure 2:
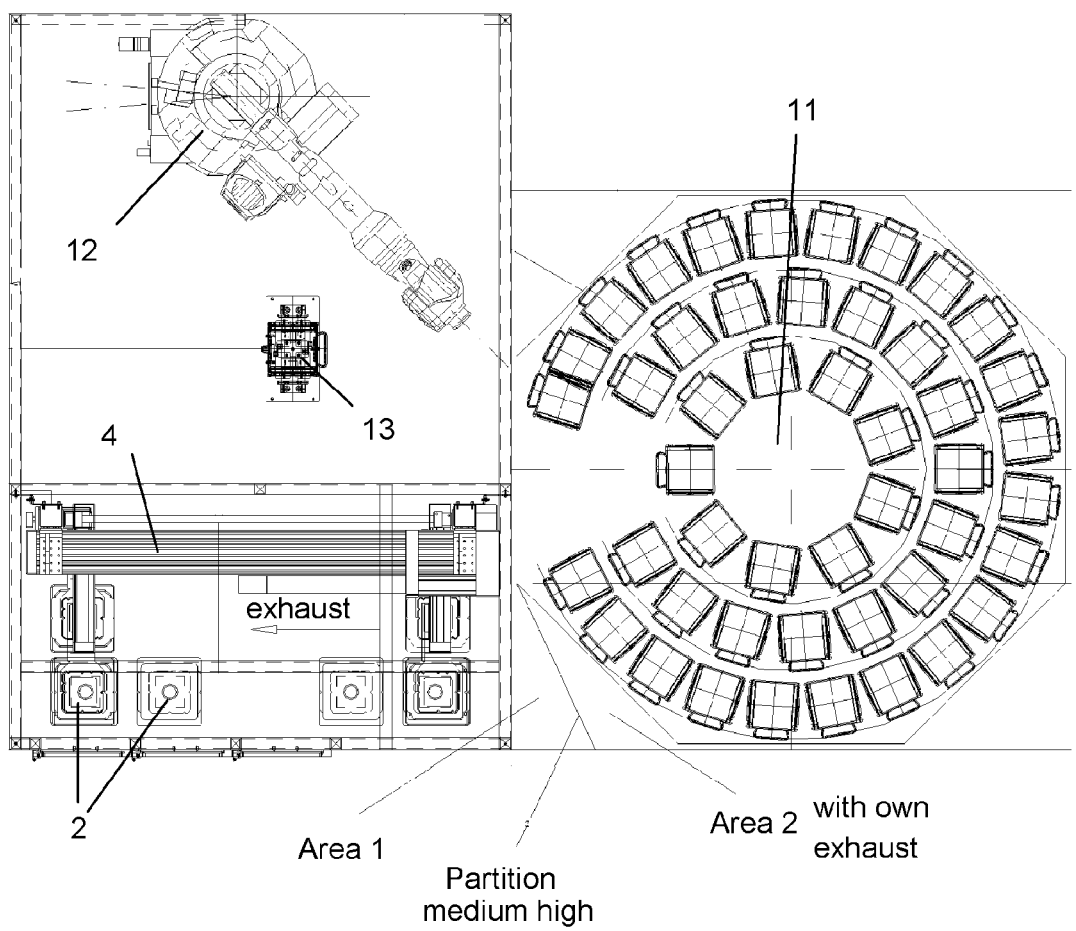
FIG. 2 shows a top view of an embodiment of a reticle stocker, utilizing buffer stations.

FIG. 2 shows a schematic of a top view of a reticle stocker according to one embodiment of the present invention. The stocker comprises a storage area 11 with 3 concentric ring storage areas, with a robotic 12 access. There is a storage box assembly system 13, for assembling and disassembling a bare article with a storage box, when coming or leaving the storage area 11. Also shown is the 4 IO loaders 2 for OHT transport, together with a 2-D linear guide 4 for robotic handling of IO loaders 1 and output buffer 3.

The stocker can store temporarily the workpieces before and after the individual process steps. Also, the stocker can store supply and raw material for a new production load, for filling up partly filled loads, or for test workpieces for testing a production process. The wafers can be stored bare or in containers, such as cassettes or pods, each of which can hold up to 25 wafers. The reticles also can be stored bare or in single storage container, each typically contains one reticle. The cassettes or the reticles can be stored in carriers for moving throughout the facility. Also, the stocker storage can store the workpieces in their storage boxes which is specially designed for storage. The stockers also must be kept as clean as possible, using filter, and clean air supply. The stocker comprises shelves or racks for supporting carrier boxes, each carrier box containing objects to be processed. The stocker comprises a robot for mounting the carrier boxes to or from the shelves. The stocker comprises a plurality of box-like compartments on the racks or shelves, each box-like compartment for receiving the carrier box. The carrier box contains semiconductor wafers, liquid crystal display (LCD) substrates, or similar objects. The stockers are positioned in a fabrication facility, preferably arranged between a transporting system for connecting process equipments. Each stocker has input/output (IO) loaders where the carrier boxes are brought into, and out of, the stocker. The carrier boxes being transported to or from the stocker can be handled by an operator, by a connecting transport system. Workpieces in semiconductor fabrication facility such as reticles, masks, wafer, LCD, are usually stored, handled and transported in extremely clean environments, because small particles can have great impact of process yield.

To decrease particle contamination and to enhance thereby production throughput, the stocker storage can be designed with improved and clean enclosures instead of storing the workpieces in carrier boxes.

A conventional semiconductor fabrication facility typically includes multiple fabrication areas interconnected by a path, designed for human operators or an overhead transfer system (OHT). As an alternative to the operator delivery system, there exists an overhead transport system including a monorail cable hoist. Such overhead transport systems are capable of transporting a carrier horizontally along the length of the tool bay, and picking and dropping a carrier to an IO loader. The overhead transport systems must include a clear, unobstructed path, with precision and accuracy.

The facility also includes wafer stocker storage system, spreading throughout the fabrication facility. The facility further includes reticle storage system, handling storage, retrieval and sorting of reticles, with or without transfer boxes or carrier boxes. A stocker storage comprises typically a large storage unit having a plurality of shelves on which the bare workpieces or the workpieces in storage boxes may be stored. The stocker storage further comprises a transport system for transferring the workpieces or the workpieces in storage boxes into and out of the stocker, and also for moving within the stocker.

The buffer can include a plurality of shelves, each shelf having an upper surface capable of supporting a carrier box. Shelves are designed to have minimum space, thus may be vertically spaced from each other a distance sufficient to support a carrier box, and to allow a robot to enter to transport the carrier box. In one embodiment, the shelves are aligned in a plurality of rows and columns. However the shelves may be provided in various configurations. With the presence of IO buffer at the stocker, the number of IO loaders might be decreased, allowing a reduction in tool footprint.

In one aspect, a robot is provided with ability to move in an X-Y cartesian plane, to access a plurality of shelves for either buffer or loader.

The present invention may also be embodied in a machine or computer readable format, e.g., an appropriately programmed computer, a software program written in any of a variety of programming languages. The software program would be written to carry out various functional operations of the present invention. Moreover, a machine or computer readable format of the present invention may be embodied in a variety of program storage devices, such as a diskette, a hard disk, a CD, a DVD, a nonvolatile electronic memory, or the like. The software program may be run on a variety of devices, e.g. a processor.

Figure 3:
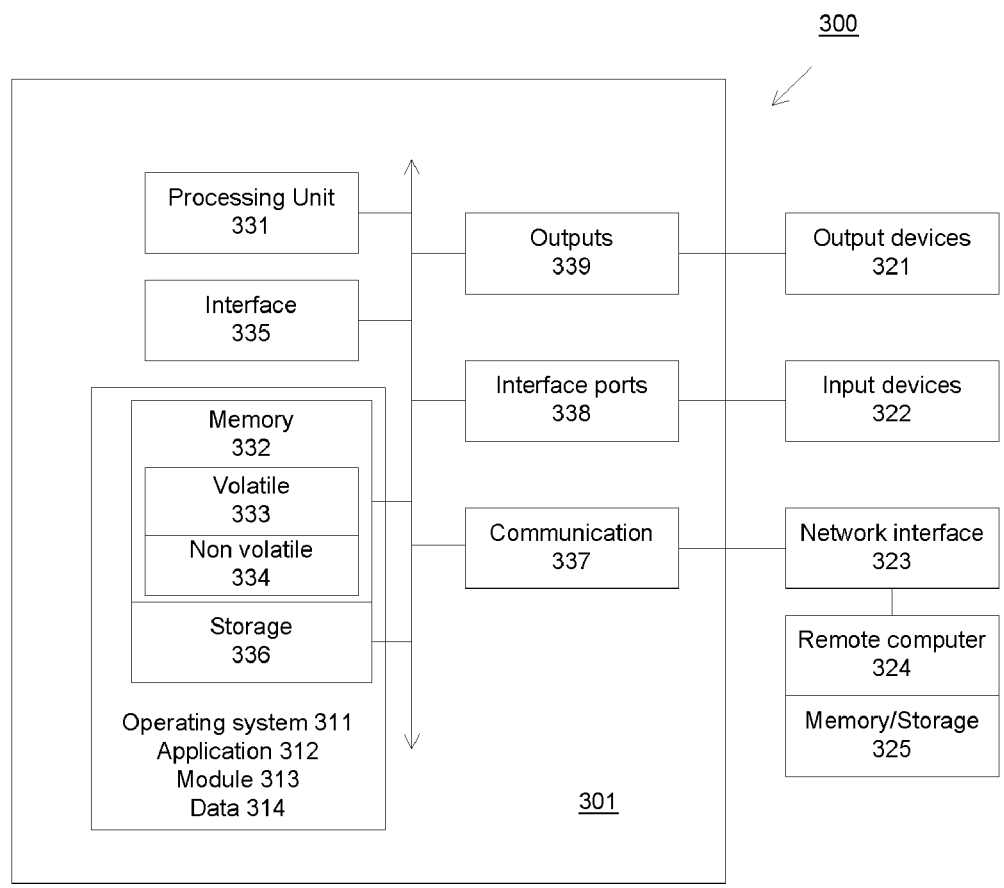
FIG. 3 shows an exemplary computer system for the present invention.

With reference to FIG. 3, an exemplary environment 300 for implementing various aspects of the invention includes a computer 301, comprising a processing unit 331, a system memory 332, and a system bus 330. The processing unit 331 can be any of various available processors, such as single microprocessor, dual microprocessors or other multiprocessor architectures. The system bus 330 can be any type of bus structures or architectures, such as 12-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), or Small Computer Systems Interface (SCST).

The system memory 332 can include volatile memory 333 and nonvolatile memory 334. Nonvolatile memory 334 can include read only memory (ROM), programmable ROM (PROM), electrically programmable ROM (EPROM), electrically erasable ROM (EEPROM), or flash memory. Volatile memory 333, can include random access memory (RAM), synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), or direct Rambus RAM (DRRAM).

Computer 301 also includes storage media 336, such as removable/nonremovable, volatile/nonvolatile disk storage, magnetic disk drive, floppy disk drive, tape drive, Jaz drive, Zip drive, LS-100 drive, flash memory card, memory stick, optical disk drive such as a compact disk ROM device (CD-ROM), CD recordable drive (CD-R Drive), CD rewritable drive (CD-RW Drive) or a digital versatile disk ROM drive (DVD-ROM). A removable or non-removable interface 335 can be used to facilitate connection.

The computer system 301 further can include software to operate in environment 300, such as an operating system 311, system applications 312, program modules 313 and program data 314, which are stored either in system memory 332 or on disk storage 336. Various operating systems or combinations of operating systems can be used.

Input devices 322 can be used to enter commands or data, and can include a pointing device such as a mouse, trackball, stylus, touch pad, keyboard, microphone, joystick, game pad, satellite dish, scanner, TV tuner card, sound card, digital camera, digital video camera, web camera, and the like, connected through interface ports 338. Interface ports 338 can include a serial port, a parallel port, a game port, a universal serial bus (USB), and a 1394 bus. The interface ports 338 can also accommodate output devices 321. For example, a USB port may be used to provide input to computer 301 and to output information from computer 301 to an output device 321. Output adapter 339, such as video or sound cards, is provided to connect to some output devices such as monitors, speakers, and printers.

Computer 301 can operate in a networked environment with remote computers 324. The remote computers 324, shown with a memory storage device 325, can be a personal computer, a server, a router, a network PC, a workstation, a microprocessor based appliance, a peer device or other common network node and the like, and typically includes many or all of the elements described relative to computer 301.

Remote computers 324 can be connected to computer 301 through a network interface 323 and communication connection 337. Network interface 323 can be communication networks such as local-area networks (LAN) and wide area networks (WAN). LAN technologies include Fiber Distributed Data Interface (FDDI), Copper Distributed Data Interface (CDDI), Ethernet/IEEE 1202.3, Token Ring/IEEE 1202.5 and the like. WAN technologies include, but are not limited to, point-to-point links, circuit switching networks like Integrated Services Digital Networks (ISDN) and variations thereon, packet switching networks, and Digital Subscriber Lines (DSL).

Figure 4:
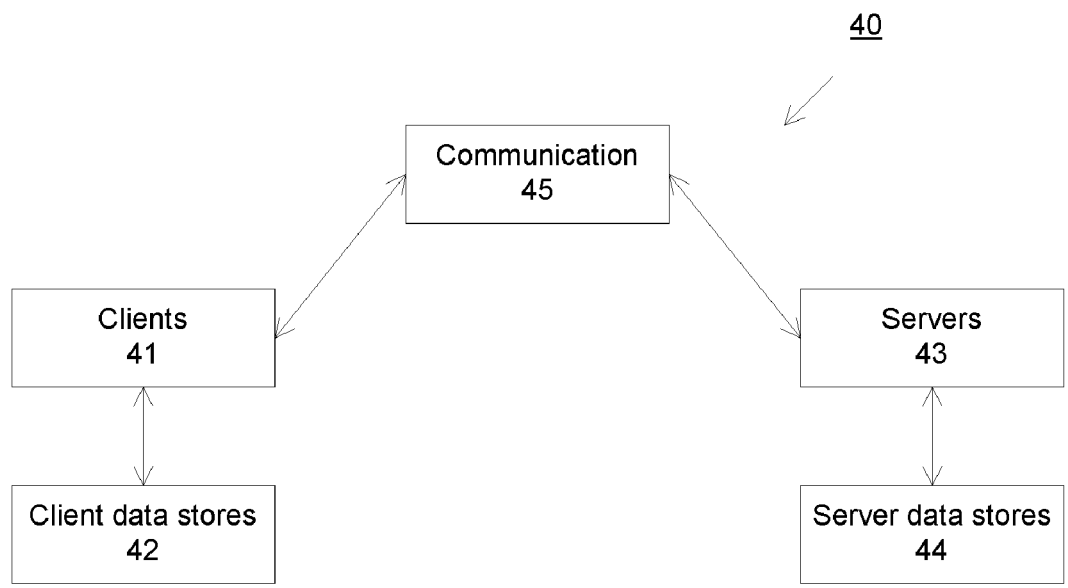
FIG. 4 shows an exemplary computer environment for the present invention.

FIG. 4 is a schematic block diagram of a sample computing environment 40 with which the present invention can interact. The system 40 includes a plurality of client systems 41. The system 40 also includes a plurality of servers 43. The servers 43 can be used to employ the present invention. The system 40 includes a communication network 45 to facilitate communications between the clients 41 and the servers 43. Client data storage 42, connected to client system 41, can store information locally. Similarly, the server 43 can include server data storages 44.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

What is claimed is:

1. A method to provide continuous operations of a facility when an equipment in the facility fails, the equipment having a chamber for holding the workpieces, the method comprising:
    storing a plurality of workpieces that are queued to be processed in a buffer station of the equipment, the buffer station separated from the chamber of the equipment,
    wherein the buffer station comprises an emergency access for externally accessing the workpieces during the time of the equipment failure without exposing the workpieces in the chamber of the equipment.

2. A method as in claim 1 further comprising
    determining a plurality of workpieces needed to be processed in a next predetermined period.

3. A method as in claim 1 wherein the next predetermined period is the average time needed to repair the equipment.

4. A method as in claim 1 wherein the emergency access is performed by an operator outside the equipment.

5. A method as in claim 1 wherein the buffer station is an IO station of the equipment with an emergency access.

6. A method to provide continuous operations of a facility comprising an equipment, the method comprising:
    retrieving a plurality of workpieces that are queued to be processed from within the equipment;
    storing the retrieved workpieces in a buffer station of the equipment, the buffer station separated from a storage chamber of the equipment,
        wherein the buffer station comprises an emergency access for externally accessing the workpieces during the time of the equipment failure the emergency access allowing removal of the workpieces in the buffer station without exposing the workpieces in the storage chamber;
    moving the workpieces from the buffer station to a separate IO station,
        wherein the IO station comprises an external access to transfer the workpiece outside the equipment.

7. A method as in claim 6 wherein the workpieces are stored in a plurality of containers.

8. A method as in claim 6 further comprising
    determining a plurality of workpieces needed to be processed in a next predetermined period.

9. A method as in claim 6 wherein the next predetermined period is the next 24 hours.

10. A method as in claim 6 wherein the next predetermined period is the average time needed to repair the equipment.

11. A method as in claim 6 wherein determining the needed workpieces is based on the workpiece flow operation of the facility.

12. A method as in claim 6 wherein the emergency access is performed by an operator outside the equipment.

13. A method to improve reliability of a workpiece stocker equipment, comprising:
    determining the workpieces that will be needed to be removed from the stocker for a next predetermined period;
    storing the workpieces in a buffer station of the stocker, the buffer station separated from a storage chamber of the stocker;
        wherein the buffer station comprises an emergency access for externally accessing the workpieces during the time of the stocker failure the emergency access allowing removal of the workpieces in the buffer station without exposing the workpieces in the storage chamber of the stocker, and
        wherein the buffer station comprises a normal access from the stocker for accessing the workpieces during the normal operation of the stocker.

14. A method as in claim 13 wherein the workpieces are stored in a plurality of containers.

15. A method as in claim 13 wherein the next predetermined period is the next 24 hours.

16. A method as in claim 13 wherein the next predetermined period is the average time needed to repair the equipment.

17. A method as in claim 13 wherein the emergency access is performed by an operator outside the equipment.

18. A machine readable medium containing machine executable program instructions which, when executed by a data processing system, cause the data processing system to perform a method for improving continuous operation of a facility, the method comprising:
    determining a plurality of workpieces that will be needed to be removed from the equipment for a next predetermined period,
    wherein the determined workpieces are removed from the equipment and stored in a buffer station, the buffer station separated from a storage chamber of the equipment, the buffer station comprising an emergency access for externally accessing the workpieces during the time of the equipment failure, the emergency access allowing removal of the workpieces in the buffer station without exposing the workpieces in the storage chamber of the equipment.

19. A medium as in claim 18 wherein the next predetermined period is the average time needed to repair the equipment.

20. A medium as in claim 18 wherein the equipment comprises a wafer stocker, a plat panel display stocker, or a reticle stocker.

* * * * *